(12) United States Patent
Chou

(10) Patent No.: US 8,143,528 B2
(45) Date of Patent: Mar. 27, 2012

(54) PRINTED CIRCUIT BOARD AND METHOD OF MANUFACTURING THE SAME

(75) Inventor: Hou-Yuan Chou, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 636 days.

(21) Appl. No.: 12/277,250

(22) Filed: Nov. 24, 2008

(65) Prior Publication Data

US 2010/0101850 A1    Apr. 29, 2010

(30) Foreign Application Priority Data

Oct. 23, 2008  (CN) .......................... 2008 1 0305114

(51) Int. Cl.
*H05K 1/03* (2006.01)
(52) U.S. Cl. ......................... 174/255; 174/261; 29/842

(58) Field of Classification Search ................... 174/255; 29/842
See application file for complete search history.

(56) References Cited

U.S. PATENT DOCUMENTS

| | | | |
|---|---|---|---|
| 6,259,038 B1 * | 7/2001 | Sakaguchi et al. ............ | 174/261 |
| 6,624,729 B2 * | 9/2003 | Wright et al. ................. | 333/238 |
| 7,501,583 B2 * | 3/2009 | Chao et al. .................... | 174/255 |

\* cited by examiner

*Primary Examiner* — Ishwarbhai Patel
(74) *Attorney, Agent, or Firm* — Altis Law Group, Inc.

(57) ABSTRACT

A printed circuit board includes a signal layer, an insulation layer, and a reference layer. A transmission line is located on the signal layer. A probing pad is located on the transmission line. Two aligned slots defined in opposite sides of the reference layer leaving a connecting portion. The slots and the connecting portion are in vertical alignment with the probing pad. The signal layer, the insulation layer, and the reference layer are configured in a cascading order. An arrangement of the signal layer in relation to the reference layer including the slots and the connecting portion reduces a capacitance effect caused by the probing pad.

17 Claims, 6 Drawing Sheets

PRINTED CIRCUIT BOARD AND METHOD OF MANUFACTURING THE SAME

BACKGROUND

1. Technical Field

The present disclosure relates to printed circuit boards (PCBs) and manufacturing methods, and in particular, to a PCB and a manufacturing method of the PCB which can reduce capacitance effects on the PCB.

2. Description of the Related Art

When an important transmission line of a PCB is in a ball grid array (BGA) or other limited space package, it is hard to access for debugging purposes. A designer will often opt to add a probing pad on the transmission line to make debugging easier. The probing pad is used for easily testing a transmission signal of the transmission line with a probe. However, adding the probing pad is equal to adding a parasitic capacitor in the transmission line, which may affect the quality of the transmission signal.

DETAILED DESCRIPTION

Figure 1:
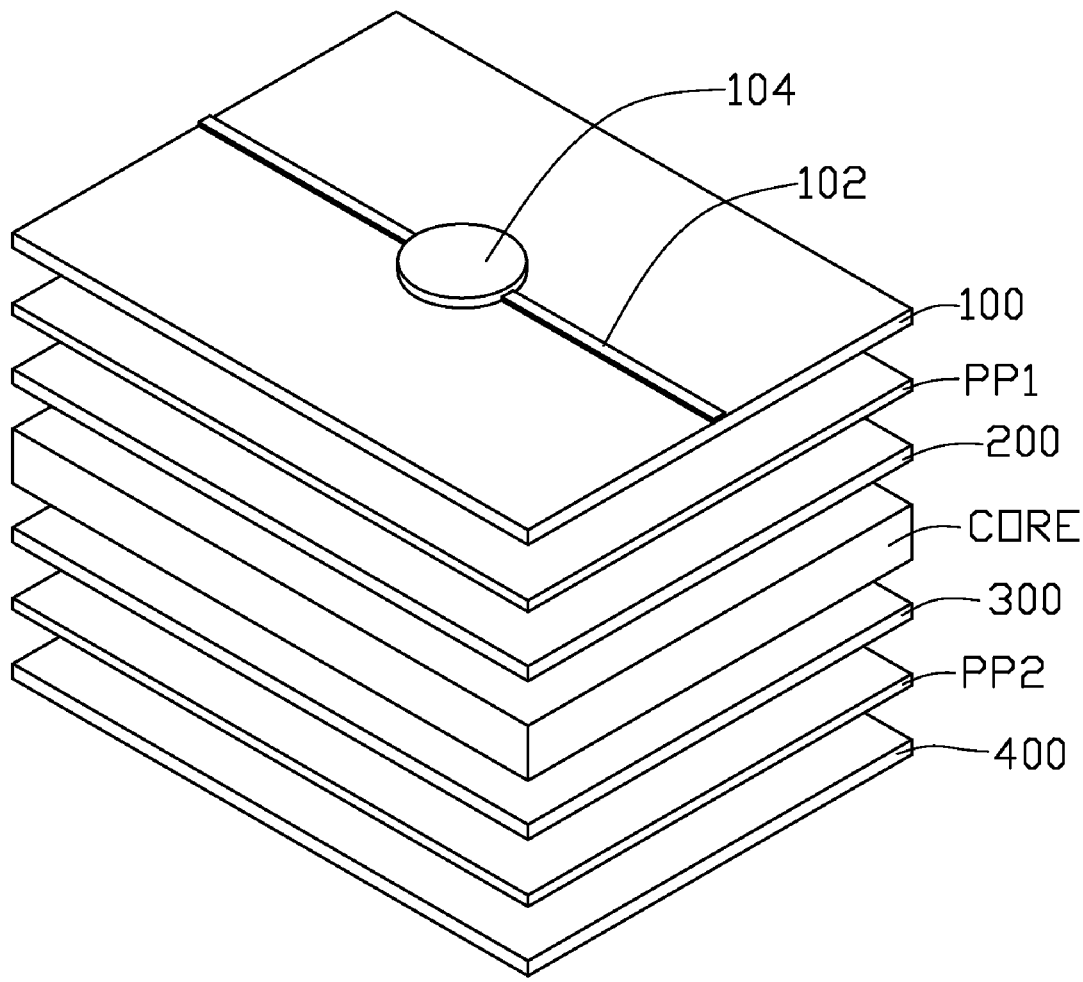
FIG. 1 is an isometric, exploded view of an exemplary embodiment of a printed circuit board including a first signal layer, a first prepreg, and a power layer.
Figure 2:
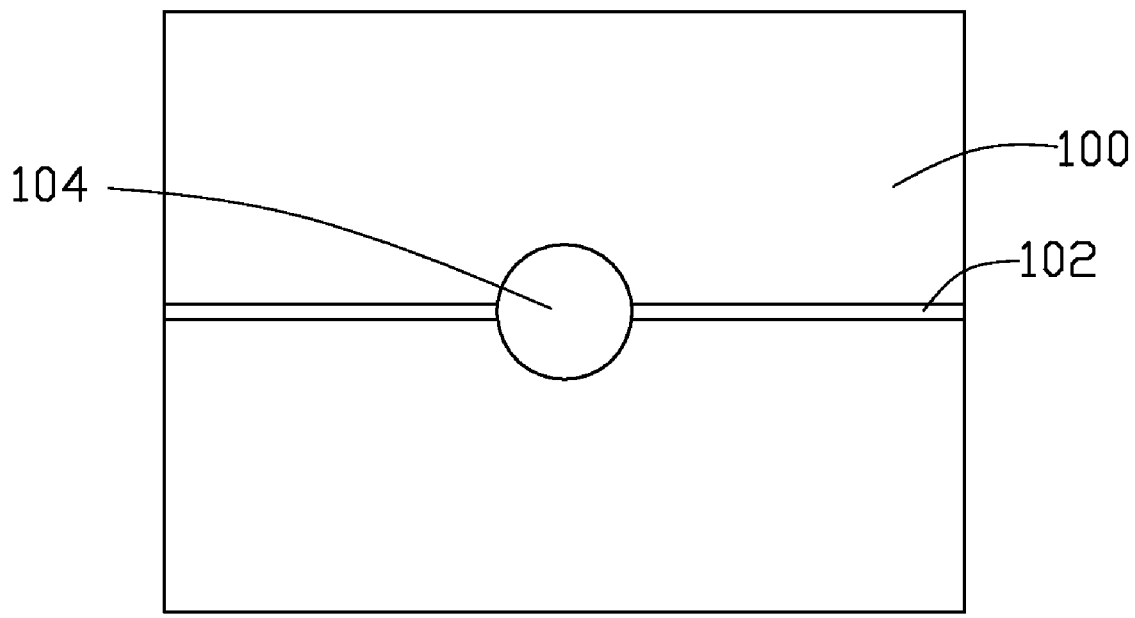
FIG. 2 is a top plan view of the first signal layer of FIG. 1.

Referring to FIGS. 1 and 2, an exemplary embodiment of a printed circuit board (PCB) 10 includes a first signal layer 100, a power layer 200, a ground layer 300, and a second signal layer 400. The first signal layer 100 is mounted on a first prepreg PP1, and configured for signal transmission. The term "prepreg" refers to a "pre-impregnated" composite fiber layer. Further details of the layer will be explained in further detail below. The power layer 200 is mounted under the first prepreg PP1, and configured for supplying power for the first signal layer 100 and the second signal layer 400. The first prepreg PP1, functioning as a first insulation layer, is configured for insulating the first signal layer 100 from the power layer 200. The ground layer 300 is mounted on a second prepreg PP2, and configured for grounding the first signal layer 100 and the second signal layer 400. The second signal layer 400 is mounted under the second prepreg PP2, and configured for signal transmission. The second prepreg PP2, functioning as a second insulation layer, is configured for insulating the ground layer 300 from the second signal layer 400. The power layer 200 functions as a reference layer of the first signal layer 100. The ground layer 300 functions as a reference layer of the second signal layer 400. The power layer 200 and the ground layer 300 are agglutinated to and insulated by a core board CORE. The first signal layer 100, the power layer 200, the ground layer 300, and the second signal layer 400 are configured in a cascading order.

The first prepreg PP1 and the second prepreg PP2 are made of insulation carrier materials, such as glass fiber mats which have been impregnated with epoxy resin. The first prepreg PP1, the second prepreg PP2, and the core board CORE are capable of insulating the first signal layer 100, the power layer 200, the ground layer 300, and the second signal layer 400 from each other. A transmission line 102 is located on the first signal layer 100, and configured for transmitting a transmission signal in a first direction. A probing pad 104 is located on the transmission line 102, specifically, a center of probing pad 104 is located on a centerline of the transmission line 102. Surfaces of the first signal layer 100 and the second signal layer 400 are covered with solder mask (not shown) to protect or mask certain areas of the PCB 10. Since the solder mask covers most of the surface of the PCB 10, the solder mask can protect circuits of the PCB 10 and provide electrical insulation. The transmission line 102 is covered with the solder mask, but the probing pad 104 is not.

Figure 3:
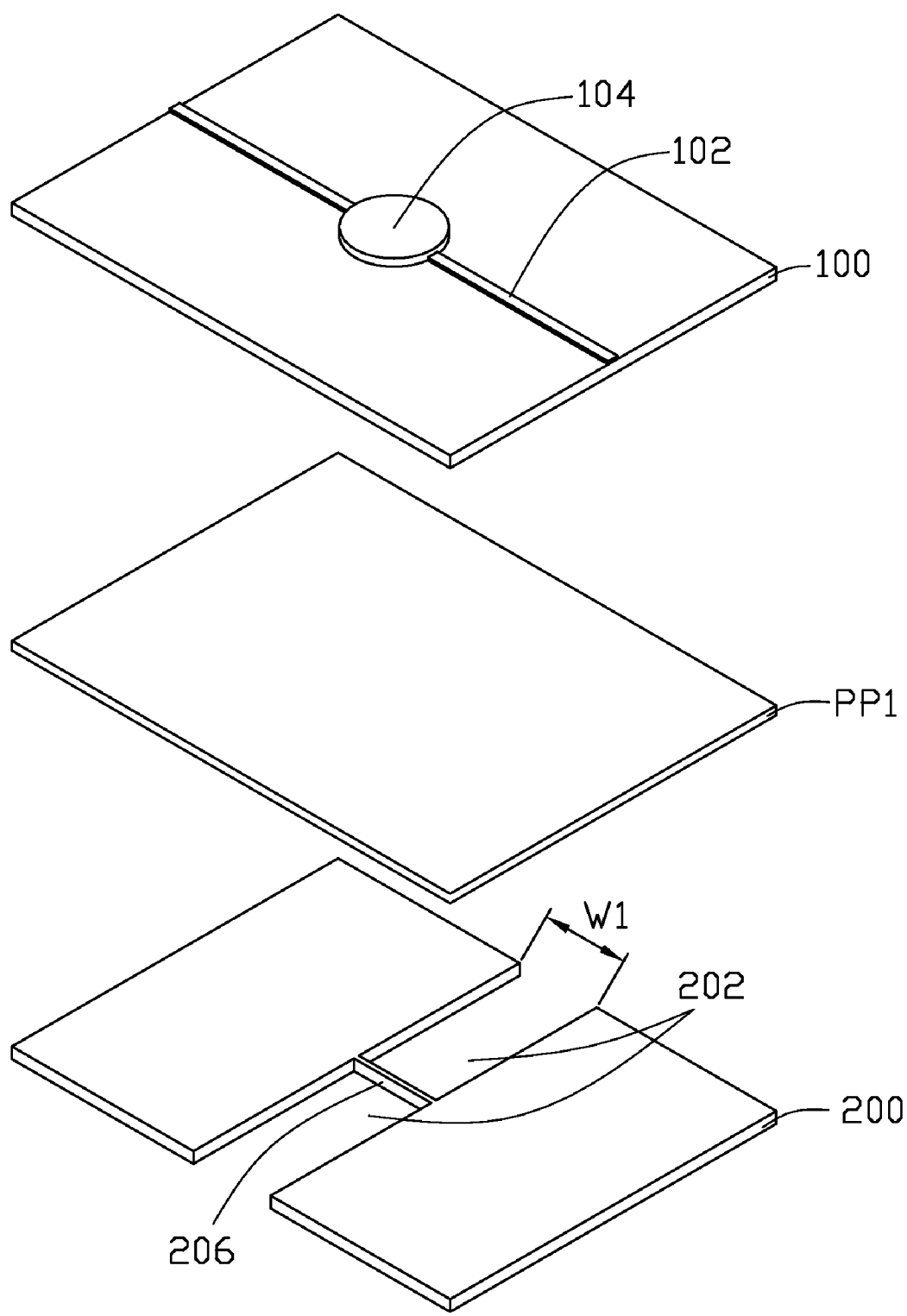
FIG. 3 is an exploded, isometric view of the first signal layer, the first prepreg, and the power layer of FIG. 1, the first signal layer includes a probing pad, the power layer defines a slot with a connecting portion.

Referring to FIG. 3, two aligned slots 202 are defined on opposite sides of the power layer 200 to divide the power layer 200 into two parts, leaving a narrow electrically connecting portion 206 between the slots 202 to connect the separated two parts the power layer 200. The slots 202 are in vertical alignment with the probing pad 104, extend along a second direction perpendicular to the first direction, and are configured for cutting off a return path of the transmission signal transmitted by the transmission line 102 in the power layer 200. The connecting portion 206 is in vertical alignment with the center of the probing pad 104, parallel to the first direction, and perpendicular to the slots 202, and acts as a return path for the transmission signal transmitted by the transmission line 102 in the power layer 200. A width of the connecting portion 206 is less than a diameter of the probing pad 104. A projection of the probing pad 104 on the power layer 200 is within the slots 202. In one embodiment, a length of the connecting portion 206 is equal to a width W1 of the slots 202, which is equal to the diameter of the probing pad 104. The slots 202 and the connecting portion 206 are formed by etching a copper foil of the power layer 200, which reduces a capacitance effect caused by the probing pad 104.

Figure 4:
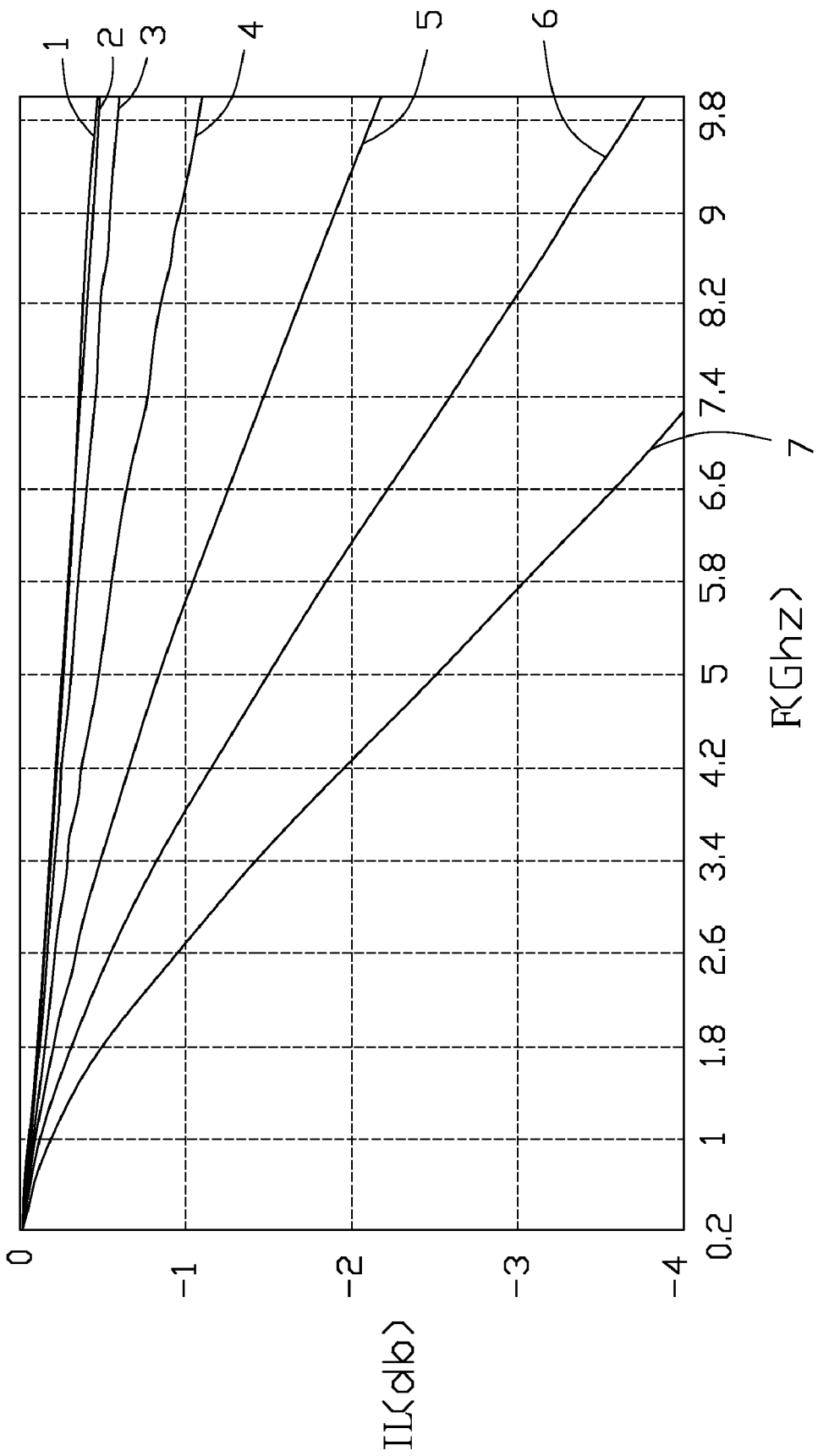
FIG. 4 is one embodiment of a signal attenuation graph when the power layer does not define the slot with the connecting portion at different radiuses of the probing pad of FIG. 3.
Figure 5:
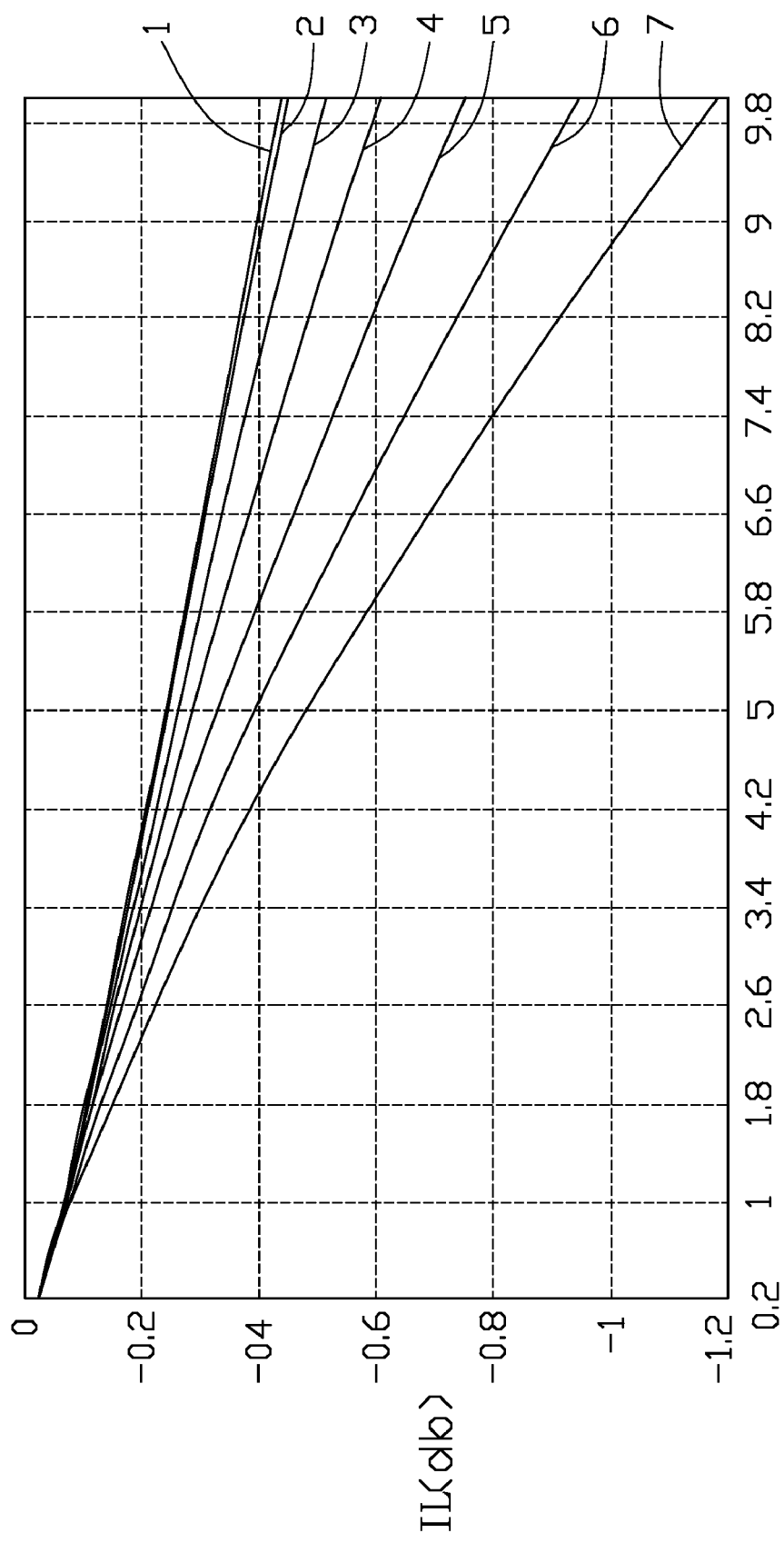
FIG. 5 is one embodiment of a signal attenuation graph when the power layer defines the slot with the connecting portion at different radiuses of the probing pad of FIG 3.

In FIG. 4 and FIG. 5, the abscissa is a frequency F of a transmission signal transmitted through the transmission line 102, the ordinate is an insertion loss IL of the transmission signal, and the curve 1 shows exemplary signal attenuation values when the PCB 10 does not include the probing pad 104, the slot 202, and the connecting portion 206. In FIG. 4, the curves 2-7 show exemplary signal attenuation values when the PCB 10 does not include the slots 202 and the connecting portion 206 but includes the probing pad 104 with a radius R1 of 5 mils, 10 mils, 15 mils, 20 mils, 25 mils, and 30 mils. In FIG. 5, the curves 2-7 show exemplary signal attenuation values when the PCB 10 includes the slots 202, the connecting portion 206 and the probing pad 104 with a radius R1 of 5 mils, 10 mils, 15 mils, 20 mils, 25 mils, and 30 mils. Comparing FIG. 4 with FIG. 5, when the PCB 10 includes the slots 202 and the connecting portion 206, the signal attenuation caused by the probing pad 104 is obviously less.

In one embodiment, parameters of the PCB 10 are as follows: thickness of each of the first signal layer 100 and the second signal layer 400 is about T1=1.6 mils; thickness of each of the power layer 200 and the ground layer 300 is about T2=1.2 mils; thickness of the solder mask on each of the first signal layer 100 and the second signal layer 400 is about T3=0.7 mils; thickness of the solder mask on the transmission line is about T4=0.5 mils; thickness of each of the first prepreg PP1 and the second prepreg PP2 is about T5=2.6 mils; dielectric constant of each of the first prepreg PP1 and the second prepreg PP2 is about Dk1=3.7; dissipation factor of each of the first prepreg PP1 and the second prepreg PP2 is about Df1=0.02; thickness of the core board CORE is about T6=47 mils; radius of the probing pad 104 is about R1=15 mils; dielectric constant of the probing pad 104 is about Dk2=4.0; dissipation factor of the probing pad 104 is about Df2=0.02; thickness of the transmission line 102 is about T7=1.6 mils; length of the transmission line 102 is about L1=400 mils; the width W1 of the slots 202 is about 30 mils. The PCB 10 can be simulated using a simulation software according to the above-mentioned parameters in order to determine an optimum width W2 of the connecting portion 206.

Figure 6:
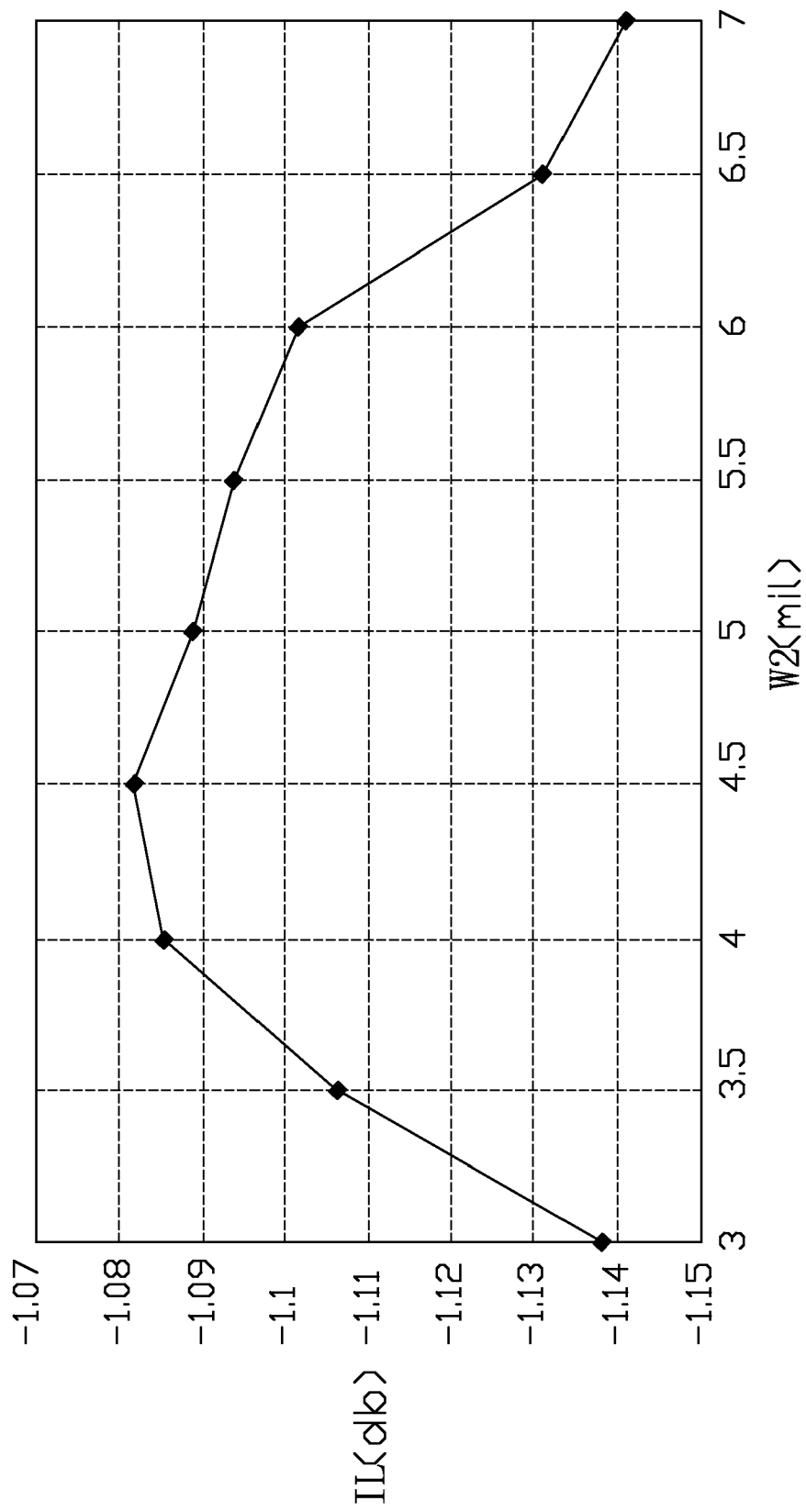
FIG. 6 is one embodiment of a signal attenuation graph when the frequency of the signal is 10 Ghz at different widths of the connecting portion of FIG. 3.

FIG. 6 is one embodiment of an attenuation graph of a transmission signal transmitted through the transmission line 102 when the frequency of the transmission signal is about 10 Ghz at different values of the width W2 of the connecting portion 206. The abscissa of FIG. 6 is the width W2 of the connecting portion 206, and the ordinate of FIG. 6 is the insertion loss IL of the transmission signal. It can be seen in FIG. 6 that the optimum width W2 of the connecting portion 206 is about 4.5 mils when the radius R1 of the probing pad 104 is about 15 mils.

In other embodiments, the slots 202 and the connecting portion 206 can be defined in the ground layer 300 when the transmission line 102 and the probing pad 104 are located on the second signal layer 400. The PCB 10 can also be 2-layer or multi-layer PCB. When the PCB 10 is 2-layer PCB, the power layer 200 and the ground layer 300 are arranged at a same layer to function as a reference layer of the first signal layer 100. In summary, with the slots 202 and the connecting portion 206 defined in a reference layer adjacent to a signal layer which has the probing pad 104, and an arrangement of the signal layer in relation to the reference layer includes the slots 202 and the connecting portion 206, the capacitance effect that could be caused by the probing pad 104 is reduced if not substantially eliminated.

It is to be understood, however, that even though numerous characteristics and advantages of the present disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A printed circuit board, comprising:
  a signal layer configured for signal transmission;
  a reference layer parallel to the signal layer, and sandwiching an insulation layer with the signal layer;
  a transmission line located on the signal layer, and configured for transmitting a transmission signal in a first direction;
  a probing pad located on the transmission line and configured for testing the signal in response to a contact with a probe, wherein a center of the probing pad is located on a centerline of the transmission line, and a diameter of the probing pad is greater than a width of the transmission line; and
  two aligned slots defined in the reference layer and extending toward each other from opposite edges of the reference layer to divide the reference layer into two parts, leaving a connecting portion between the slots to connect the separated two parts of the reference layer, wherein a length of the connecting portion is substantially equal to the diameter of the probing pad;
  wherein the slots are in vertical alignment with the probing pad, extend along a second direction perpendicular to the first direction, and are configured for cutting off a return path of the transmission signal in the reference layer, and wherein the connecting portion is in vertical alignment with the center of the probing pad and parallel to the first direction, and acts as a return path for the transmission signal in the reference layer, thereby reducing a capacitance effect caused by the probing pad.

2. The printed circuit board of claim 1, wherein the reference layer is a power layer.

3. The printed circuit board of claim 1, wherein the reference layer is a ground layer.

4. The printed circuit board of claim 1, wherein a width of the connecting portion is less than a diameter of the probing pad.

5. The printed circuit board of claim 1, wherein a projection of the probing pad on the reference layer is within the slots.

6. The printed circuit board of claim 1, wherein a radius of the probing pad is about 15 mils.

7. The printed circuit board of claim 1, wherein a width of the connecting portion is about 4.5 mils.

8. The printed circuit board of claim 1, wherein the slots and the connecting portion are formed by etching a copper foil of the reference layer.

9. The printed circuit board of claim 1, wherein the transmission line is covered with solder mask, and the probing pad is not covered with the solder mask.

10. A method of manufacturing a printed circuit board with a probing pad, comprising:
  providing a printed circuit board;
  providing a transmission line on a signal layer of the printed circuit board and providing a probing pad on the transmission line, wherein a center of the probing pad is located on a centerline of the transmission line, a diameter of the probing pad is greater than a width of the transmission line, the signal layer is configured for signal transmission, the transmission line is capable of transmitting a signal in a first direction, and the probing pad is configured for testing the signal in response to a contact with a probe;
  defining two aligned slots in a reference layer of the printed circuit board and extending toward each other from opposite edges of the reference layer to divide the reference layer into two parts, leaving a connecting portion between the slots to connect the separated two parts of the reference layer, wherein a length of the connecting portion is substantially equal to the diameter of the probing pad, wherein the slots are in vertical alignment with the probing pad, extend along a second direction perpendicular to the first direction, and are configured for cutting off a return path of the transmission signal in the reference layer, and wherein the connecting portion is in vertical alignment with the center of the probing pad and parallel to the first direction, and acts as a return path for the transmission signal in the reference layer; and
  configuring the signal layer, an insulation layer of the printed circuit board, and the reference layer in a cascading order;
  wherein an arrangement of the signal layer in relation to the reference layer comprising the slots and the connecting portion reduces a capacitance effect caused by the probing pad.

11. The method of claim 10, wherein the reference layer is a power layer.

12. The method of claim 10, wherein the reference layer is a ground layer.

13. The method of claim 10, wherein a width of the connecting portion is less than a diameter of the probing pad.

14. The method of claim 10, wherein a projection of the probing pad on reference layer is within the slots.

15. The method of claim 10, wherein a radius of the probing pad is about 15 mils.

16. The method of claim 10, wherein a width of the connecting portion is about 4.5 mils.

17. The method of claim 10, wherein the slots and the connecting portion are formed by etching a copper foil of the reference layer.

* * * * *